United States Patent [19]

Sutcliffe et al.

[11] Patent Number: 5,358,602
[45] Date of Patent: Oct. 25, 1994

[54] METHOD FOR MANUFACTURE OF PRINTED CIRCUIT BOARDS

[75] Inventors: Gary R. Sutcliffe, Kensington; Jay B. Conrod, Cheshire, both of Conn.

[73] Assignee: Enthone-OMI Inc., West Haven, Conn.

[21] Appl. No.: 163,042

[22] Filed: Dec. 6, 1993

[51] Int. Cl.$^5$ .................. B44C 1/22; B29C 37/00; C23F 1/00
[52] U.S. Cl. .................. 156/656; 156/666; 156/668; 156/902; 428/209; 428/901; 427/304; 427/307
[58] Field of Search .............. 156/634, 654, 655, 656, 156/659.1, 666, 902, 668; 29/846, 852; 427/96, 304, 97, 306, 98, 307; 428/209, 901

[56] References Cited

U.S. PATENT DOCUMENTS

| | | | |
|---|---|---|---|
| 3,011,920 | 12/1961 | Shipley, Jr. ................. | 117/213 |
| 3,099,608 | 7/1963 | Radovsky et al. ............. | 204/15 |
| 4,171,225 | 10/1979 | Molenaar et al. ............. | 106/123 |
| 4,895,739 | 1/1990 | Bladon ...................... | 427/304 |
| 4,933,010 | 6/1990 | Okabayashi .................. | 106/1.11 |
| 5,158,645 | 10/1992 | Covert et al. ............... | 156/902 X |
| 5,213,841 | 5/1993 | Gulla et al. ................ | 427/98 |

OTHER PUBLICATIONS

Autocatalytic Deposition of Tin, A. Molenaar and J. W. G. deBakker, Philips Research Laboratories, 5600 JA Eindhoven, The Netherlands, J. Electrochem. Soc., vol. 136, No. 2, Feb. 1989, pp. 378–382.

Electroplating, Federick A. Lowenheim, McGraw-Hill Book Company, pp. 404–405 and 418–423.

*Primary Examiner*—William Powell
*Attorney, Agent, or Firm*—DeLio & Peterson

[57] ABSTRACT

A method for the manufacture of printed circuit boards is provided comprising conditioning the board, activating with a catalytic metal, post-activating, stabilizing and etching the copper surfaces before the desired circuit is formed on the board. This process eliminates the need for a flash coating of copper in the through holes before the use of protective coatings such as imaging resists and soldermasks.

14 Claims, No Drawings

METHOD FOR MANUFACTURE OF PRINTED CIRCUIT BOARDS

BACKGROUND OF THE INVENTION

1. Field of the Invention

This invention relates to a method for the manufacture of printed circuit boards and, in particular to improving the method by eliminating the need for a first electroless flash metal plating of the through holes prior to the use of protective coatings such as plating resists and soldermasks.

2. Description of Related Art

The metal plating of plastics and other nonconductive (dielectric) substrates is well-known in the art and the following description will be directed for convenience to plastics, especially epoxy, and the preparation of printed circuit boards.

The preparation of printed circuit boards requires the plating of conductive metal layers, usually copper, onto the plastic substrate of the board. These boards vary in design and may have a copper layer on each surface of the epoxy (two-sided boards) or they can be multi-layer boards which have a plurality of inter-leaved parallel planar copper and epoxy layers. In both types, through-holes are drilled in the board and metal plated to facilitate connection between the circuits on the copper layers.

There are basically two methods for preparing the boards, the "substractive" method and the "additive" method with many variations in the process steps being employed depending on the type board desired. Regardless of the methods used, however, the need exists to apply and remove protective films on the board during the process.

For purposes of illustration the semi-additive method will be described although the invention is applicable to other methods of manufacture. Commencing with a commercially available copper clad laminate or multilaminate made from, e.g., paper-epoxy or glass-epoxy material, a predesigned series of through-holes is formed in the board in any conventional manner, then preferably treated to desmear or etch the plastics prior to the metal plating. A swell and etch procedure is usually used to treat the board and in one process the board is first contacted with a solvent to swell the epoxy and enhance the effect of the subsequent oxidative, e.g., permanganate solution etching step. After etching, the board is water rinsed and then neutralized with a reductant to solubilize manganese residues by lowering their oxidation state. The reductant preferably contains an acid fluoride to dissolve glass fibers in the epoxy. Thereafter the board is immersed in a catalyst, such as a tin-palladium solution, which activates the surface of the epoxy for electroless copper plating. Following a water rinse, the laminate is immersed in an accelerator to activate the catalyst by freeing the metal palladium ions on the board. After a water rinse, the board is dried and is immersed in an electroless copper plating solution for a period of time sufficient to flash plate copper on the through-hole connections.

The board is then coated with a photoresist (usually with tenting (covering) of the through holes), imaged and the unwanted copper etched using ammonium persulfate or other etchant. The photoresist is removed using a solvent such as KOH and a soldermask applied to cover the desired circuits. Electroless copper in this case is then plated on the pads and through holes for about 12-5 hours to build the copper thickness up to about 1-1.5 mils.

Flash plating is necessary to permit plating after the imaging process since the activation systems have not been able to withstand this procedure. Also, the above procedure is time consuming and costly and it is preferred to improve the process by eliminating the need for the flash electroless copper plating of the board prior to application of the coatings such as an imaging film and the procedures associated therewith.

It is an object of the invention to provide an improved process for manufacturing printed circuit boards in which a flash coating of copper is not required on the through holes during the board making process.

A further object is to provide a printed circuit board made by the improved process.

Other objects and advantages will be apparent for the following description.

SUMMARY OF THE INVENTION

It has now been discovered that printed circuit boards may be made by using a process comprising:
(a) contacting the substrate with a conditioner to clean the substrate surface;
(b) contacting the conditioned substrate with a metal containing activator solution to activate (catalyze) the substrate surface for plating;
(c) treating the activated substrate with a post-activator solution;
(d) treating the resulting substrate with a stabilizer, e.g., acid, to stabilize the substrate; and
(e) treating the stabilized substrate with an etchant to etch the copper surfaces.

In a preferred embodiment, the activator is a tin-palladium catalyst solution well-known in the art as exemplified in U.S. Pat. Nos. 3,011,920; 3,532,518 and 3,672,938 which patents are hereby incorporated by reference. In another preferred embodiment as shown in U.S. Pat. No. 4,933,010 the activator solution is a concentrated HC1 free activator which comprises stannous chloride, and palladium chloride colloidally dispersed in an aqueous solution of saturated sodium chloride.

DESCRIPTION OF THE PREFERRED EMBODIMENTS

The process of the invention has been found to be particularly useful for treating epoxy resins although other suitable polymeric resins such as polyimide, ABS, polycarbonate and Noryl ® may also be employed.

The resin may contain glass fibers, paper, synthetic fibers, carbon black, alumina powders, silica powders, wax, etc., as fillers, pigments, mold release agents, reinforcing agents, etc.

The resin is first conditioned as noted hereinabove and is ready for activation. It is preferred to use Envision DPS Conditioner 5625 supplied by Enthone-OMI Inc., which contains isopropanol, triethanolamine and monoethanolamine, because of its demonstrated effectiveness. It is preferred that a pre-dip be used after conditioning to prevent drag-in from the prior baths. Generally, the composition of the pre-dip contains anions common to the activator solution and in about the same proportion. For example, if a palladium chloride-stannous chloride-sodium chloride activator is used, the pre-dip will contain predominately sodium chloride in an amount about the same as in the activator solution. A composition such as Envisions DPS Carrier 5630 may be employed for this purpose.

Any suitable catalytic metal, e.g., a noble metal, containing activator solution may be employed in the process of the invention. Generally, the activator is the well-known stabilized reaction product of stannous chloride and palladium chloride which is sold dry or as a concentrated solution in HCl. The older two-step process consisted of separate HCl solutions of stannous chloride and palladium chloride and may be employed but is not preferred because it is not economically for most uses. Other precious metals may be used but are generally not cost effective. Exemplary activator compositions are shown in U.S. Pat. Nos. 3,011,920; 3,532,518 and 3,672,938. In general, a commercial activator composition contains 0.1-1 g/l $PdCl_2$, 20-50 g/l $SnCl_2$ and 15-50 g/l HCl.

A preferred activator type composition is disclosed in U.S. Pat. No. 4,933,010, which patent is hereby incorporated by reference. In this patent, a concentrated HCl free activator for chemical plating is shown which contains stannous chloride, and palladium chloride colloidally dispersed in an aqueous solution of saturated sodium chloride. Preferably the activator includes 5 to 10 g/l of stannous chloride, 0.1 to 0.2 g/l of palladium chloride, 0.05-10 volume/volume percent of sulfuric acid, and 50-280 g/l of sodium chloride, and optionally, 0.015-0.03 g/l vanillin.

Another preferred activator because of its demonstrated effectiveness is termed Envision DPS activator 5635 and contains palladium chloride, stannous chloride, HCl and resorcinol. A composition comprising 9% by volume DPS 5635, 290 g/l NaCl, 5 gml/l HCl 37% has been found to provide excellent results. The activated resin is now treated at an effective temperature for a suitable time with a post-activator in order to obtain the surface conductivity on the resin needed to electrolessly or electrolytically plate the resin. Post-activation (also known as acceleration) of activated resins for electroless plating is well-known in the art and it is generally accepted that this step modifies the surface layer of the palladium nuclei, and stannous and stannic hydrous oxides and oxychlorides. Any acid or alkaline solutions in which excess tin is appreciably soluble and catalytic palladium nuclei become exposed have been employed in the prior art. A resin activated with a commercial palladium-tin HCl solution is usually post-activated with dilute sulfuric acid (10% by volume) by immersion for about 5 minutes at room temperature.

It is important in the subject process however that the resistivity of the resin surface be less than about 250 ohms, preferably less than about 100 ohms and most preferably less than about 20 ohms or even 10 ohms. The resistivity is measured by side to side contact of a printed circuit board with conductivity meter pins. Using the conventional steps for electroless plating as noted above, the resistivities obtained are typically above about 1000 ohms.

Broadly stated, the post-activator is preferably an alkaline solution having a pH greater than about 11, e.g. 11.5-12.5, and comprises an effective amount of metal ions such as silver and copper which undergo a disproportionation reaction during the treatment. Preferred compositions are disclosed in an article entitled "Autocatalytic Deposition of Tin" by A. Molenaar and J. W. G. de Bakker, J. Electrochem. Soc., Vol. 136, No. 2, February 1989, pages 378-382.

In another preferred embodiment, the post-activator solution comprises a sodium carbonate solution containing copper II ions. A preferred solution is Envision DPS Generator 5640 which contains sodium and potassium carbonate and copper sulfate.

To practice the method of the invention the activated plastic substrate is then contacted with the post-activator composition at an elevated temperature for a time sufficient to render the surface sufficiently conductive for electroless or electrolytic plating. Contacting procedures may vary widely and satisfactory results for epoxy resin are provided by immersing the part in the activator solution for 5 to 15 minutes at 35° to 50° C. or higher. Contacting of the resin in the post-activator solution is also about 5 to 15 minutes, preferably 8 to 12 minutes, at 55° to 70° C. or higher, preferably 60° to 65° C. The times and temperatures may be longer and/or lower or higher than noted above and will vary depending on the substrate being treated and the compositions of the solutions as will be appreciated by those skilled in the art. Other means such as spraying, dipping or flooding may be used for activating and/or post-activating the plastic part.

The substrate is now preferably contacted with an acid solution to, it is hypothesized, stabilize the post-activated surface. A 10% by volume sulfuric acid solution used at room temperature for up to about 3 minutes has been found to provide excellent results and a level of up to about 20% by volume or higher may be employed. Other suitable acids may also be employed such as HCl, acetic, etc. A preferred solution is Envision DPS Stabilizer 5645 which contains sulfuric acid.

The stabilized substrate is now treated with a solution to etch, e.g., microetch, the copper surface. A preferred solution is Envision DPS Micro Etch 5655 which contains sodium persulfate and may be applied by spraying, dipping, etc. Spraying is preferred since this cleans the activator film from the copper surfaces. An immersion procedure preferably uses a spray rinse. An etch of up to 15 to 30 microinches or more may be employed, usually about 20 to 25 microinches. An antitarnish composition may also be employed at this point such as ENTEK Antitarnish Cu-56 which contains methanol, benzotriazole and sodium meta nitrobezenesulfonate.

The desired circuit pattern may now be formed on the board by, e.g., imaging with resist materials, etching, developing, applying soldermasks, etc.

The substrate may now be metal plated using conventional electroless or electrolytic baths such as ENPLATE CU-9005 and ENPLATE CU-9011 both of which contain sodium hydroxide, copper oxide, EDTA and paraformaldehyde. Before plating however, the board may be further processed using standard techniques to condition the boards using, for example, conventional steps such as cleaning with ENPLATE PC-471 (contains sulfuric, phosphoric and hydrochloride acids), microetching using ENPLATE AD-485 (contains a proprietary mixture of inorganic salts) and a 10% $H_2SO_4$ solution to solubilize etching residues.

The present invention will now be described in detail by reference to the following examples.

EXAMPLE 1

A two-sided copper clad epoxy-glass FR-4 laminate board containing through-holes was metallized using the following procedure:

(1) immerse in Envision DPS Conditioner 5625 (10%) at 80° C., for 10 minutes;

(2) cold water rinse for 5 minutes
(3) pre-dip in Envision DPS Carrier 5630 at room temperature for 1 minute;
(4) immerse in Envision DPS Activator 5635 (9%) at 46° C. for 10 minutes;
(5) cold water rinse for 3 minutes;
(6) immerse in Envision DPS Generator 5640 (21% A, 150 g/lB and 0.4%C) at 63° C. for 10 minutes;
(7) cold water rinse for 1 minute;
(8) immerse in Envision DPS Stabilizer 5645 (22%) at room temperature for 3 minutes;
(9) cold water rinse for 1 minute;
(10) spray with Envision DPS Micro Etch 5655-25 microinch spray etch;
(11) spray ENTEK Antitarnish Cu-56, rinse and dry;
(12) tent with dry film, image and develop;
(13) etch the unwanted copper with an ammonical etchant;
(14) immerse in ENPLATE PC-471 (35%) at 38° C. for 5 minutes;
(15) cold water rinse for 5 minutes;
(16) immerse in Envision DPS Micro Etch 5655 to enhance copper to copper adhesion;
(17) cold water rinse for 2 minutes;
(18) immerse in 10% $H_2SO_4$ at room temperature for 2 minutes to solubilize residues from the micro etch solution;
(19) cold water rinse for 2 minutes;
(20) immerse in ENPLATE CU-9005 for a plating thickness of about 20 microinches; and
(21) immerse in ENPLATE CU-9011 for a plating thickness of about 1.2 mils.

The plated boards exhibited complete through hole coverage and excellent surface to hole wall distribution and physical properties. High aspect ratio boards may be made using this process, e.g., ratios of up to about 10:1 (board thickness; hole diameter) and higher.

It will thus be seen that the objects set forth above, among those made apparent from the preceding description, are efficiently attained and, since certain changes may be made in the above constructions without departing from the spirit and scope of the invention, it is intended that all matter contained in the above description shall be interpreted as illustrative and not in a limiting sense.

While the invention has been illustrated and described in what are considered to be the most practical and preferred embodiments, it will be recognized that many variations are possible and come within the scope thereof, the appended claims therefore being entitled to a full range of equivalents.

Thus, having described the invention, what is claimed is:

1. A method for making printed circuit boards comprising:
    a. contacting the board with a conditioner to clean the board surface;
    b. contacting the conditioned board with a metal containing activator to activate the board surface for plating;
    c. treating the activated board with a post-activator;
    d. treating the resulting board with a stabilizer;
    e. treating the stabilized surface with an etchant to etch the board surface;
    f. forming the desired circuit pattern on the board;
    g. plating the board to the desired thickness.

2. The method of claim 1 wherein the activator contains palladium and tin.

3. The method of claim 2 wherein the post-activator is an alkaline solution having a pH greater than about 11.

4. The method of claim 3 wherein the post-activator contains sodium carbonate and copper II ions.

5. The method of claim 3 wherein the stabilizer is acid.

6. The method of claim 5 wherein the etchant is used to provide an etch of about 15–30 microinches.

7. The method of claim 6 wherein the board is plated using an electroless copper plating bath.

8. An article of manufacture prepared according to the method of claim 1.

9. An article of manufacture prepared according to the method of claim 7.

10. The method of claim 3 wherein the post-activator contains an effective amount of metal ions which undergo a disproportionation reaction during the treatment.

11. The method of claim 10 wherein the metals ions are copper or silver.

12. The method of claim 4 wherein the post-activator further contains potassium carbonate.

13. An article of manufacture prepared according to the method of claim 1 wherein a soldermask is applied to cover the desired circuits prior to plating.

14. An article of manufacture prepared according to the method of claim 7 wherein a soldermask is applied to cover the desired circuits prior to plating.

* * * * *